(12) United States Patent
Belot et al.

(10) Patent No.: US 8,461,941 B2
(45) Date of Patent: Jun. 11, 2013

(54) BULK ACOUSTIC WAVE RESONATOR WITH ADJUSTABLE RESONANCE FREQUENCY AND USE OF SUCH A RESONATOR IN THE FIELD OF TELEPHONY

(75) Inventors: Didier Belot, Rives (FR); Andréia Cathelin, Laval (FR); Yann Deval, Bordeaux (FR); Moustapha El Hassan, El Koura (LB); Eric Kerherve, Talence (FR); Alexandre Shirakawa, San Jose, CA (US)

(73) Assignees: STMicroelectronics S.A., Montrouge (FR); Centre National de la Recherche Scientifique, Paris (FR)

( * ) Notice: Subject to any disclaimer, the term of this patent is extended or adjusted under 35 U.S.C. 154(b) by 674 days.

(21) Appl. No.: 12/523,299

(22) PCT Filed: Jan. 15, 2008

(86) PCT No.: PCT/EP2008/050365
§ 371 (c)(1),
(2), (4) Date: Nov. 12, 2009

(87) PCT Pub. No.: WO2008/090050
PCT Pub. Date: Jul. 31, 2008

(65) Prior Publication Data
US 2010/0060386 A1 Mar. 11, 2010

(30) Foreign Application Priority Data
Jan. 16, 2007 (FR) ...................................... 07 52700

(51) Int. Cl.
*H03H 9/15* (2006.01)
*H03H 9/54* (2006.01)
*H03H 3/04* (2006.01)

(52) U.S. Cl.
USPC ............ 333/188; 333/187; 333/189; 310/312

(58) Field of Classification Search
USPC .................................... 333/187–192; 310/312
See application file for complete search history.

(56) References Cited

U.S. PATENT DOCUMENTS 5,260,596 A * 11/1993 Dunn et al. ................... 257/414
6,204,737 B1 * 3/2001 Ella .............................. 333/187

(Continued)

FOREIGN PATENT DOCUMENTS

EP 0 963 000 A2 12/1999
EP 1 468 960 A2 10/2004

OTHER PUBLICATIONS

M. El Hassan et al.; "A Multistandard RF Receiver Front-End Using a Reconfigurable FBAR Filter"; 2006 IEEE North-East Workshop on Circuits and Systems, Jun. 2006, pp. 173-176.*

(Continued)

*Primary Examiner* — Barbara Summons
(74) *Attorney, Agent, or Firm* — Gardere Wynne Sewell LLP

(57) ABSTRACT

A bulk acoustic wave resonator has an adjustable resonance frequency. A piezoelectric element is provided having first and second electrodes. A switching element is provided in the form of a MEMS structure which is deformable between a first and second position. The switching element forms an additional electrode that is selectively disposed on top of, and in contact with, one of the first and second electrodes. This causes a total thickness of the electrode of the resonator to be changed resulting in a modification of the resonance frequency of the resonator.

12 Claims, 2 Drawing Sheets

U.S. PATENT DOCUMENTS

| | | | |
|---|---|---|---|
| 6,407,649 B1* | 6/2002 | Tikka et al. | 333/133 |
| 6,774,746 B2* | 8/2004 | Whatmore et al. | 333/189 |
| 7,804,382 B2* | 9/2010 | Shin et al. | 333/188 |
| 2005/0162040 A1* | 7/2005 | Robert | 310/322 |
| 2006/0139121 A1* | 6/2006 | Jhung | 333/133 |
| 2007/0152777 A1* | 7/2007 | Bouche et al. | 333/187 |

OTHER PUBLICATIONS

E. R. Brown; "RF-MEMS Switches for Reconfigurable Integrated Circuits"; IEEE Transactions on Microwave Theory and Techniques, vol. 46, No. 11, Nov. 1998, pp. 1868-1880.*

Ph. Robert et al.; "Integrated RF-MEMS Switch Based on a Combination of Thermal and Electrostatic Actuation"; The 12th International Conference on Solid State Sensors, Actuators and Microsystems, Boston, Jun. 8-12, 2003, Transducers '03, pp. 1714-1717.*

M. El Hassan et al.; "A Study on FBAR Filters Reconfiguration"; ICECS 2005, The 12th International Conference on Electronics, Circuits and Systems, Dec. 11-14, 2005, four pages.*

W. Pang et al.; "Electrically Tunable and Switchable Film Bulk Acoustic Resonator"; 2004 IEEE International Ultrasonics, Ferroelectrics, and Frequency Control Joint 50th Anniversary Conference, Frequency Control Symposium and Exposition, Aug. 23-27, 2004, pp. 22-26.*

French Search Report, PCT/EP2008/050365, May 28, 2008.

Saias, Daniel, "An Above IC MEMS RF Switch", IEEE Journal of Solid-State Circuits, vol. 38, No. 12, Dec. 2003, 0018-9200/03$17.00, 2003 IEEE, pp. 2318-2324.

* cited by examiner

BULK ACOUSTIC WAVE RESONATOR WITH ADJUSTABLE RESONANCE FREQUENCY AND USE OF SUCH A RESONATOR IN THE FIELD OF TELEPHONY

PRIORITY CLAIM

The present application is a 371 filing of PCT/EP2008/050365 filed Jan. 15, 2008 which claims priority from French Application for Patent No. 07 52700 filed Jan. 16, 2007, the disclosures of which are hereby incorporated by reference.

BACKGROUND OF THE INVENTION

1. Technical Field of the Invention

The present invention relates to acoustic resonators and, in particular, bulk acoustic resonators. Such resonators are also commonly referred to as Bulk Acoustic Wave, or BAW, resonators.

2. Description of Related Art

BAW resonators are often used to form RF filters in high-frequency front-end circuits, for example in the field of mobile telephony.

For such an application, it is often desirable for the resonators to be fabricated within high-frequency integrated circuits, to exhibit a high selectivity and a relatively high power and to be produced at a low cost.

Resonators are thus often based on the use of surface-wave, or SAW (for Surface Acoustic Wave), devices. Such filters are advantageous in that they exhibit a high selectivity. However, their frequency and their power are relatively limited.

For this reason, the fabrication of resonators using BAW technology has been proposed given that this technology allows the targeted objectives in terms of frequency, power, selectivity and cost of production to be attained. Furthermore, resonators fabricated using BAW technology can be formed directly on a fully integrated circuit, which thus allows fully integrated high-frequency front-end circuits to be fabricated.

However, a BAW bulk acoustic wave resonator is based on the use of a piezoelectric element with two electrodes. The characteristic resonance frequency of the resonator is directly linked to the thickness of the piezoelectric element and of the electrodes covering it. Accordingly, by design, the resonator only comprises a single resonance frequency.

As a consequence, one resonator must be fabricated for each resonance frequency of interest within the device being fabricated.

Thus, for the fabrication of a mobile telephone handset front-end circuit, a specific resonator must be provided for each telecommunications standard used by the handset.

There is a need in the art provide a bulk acoustic wave resonator with an adjustable resonance frequency. There is further a need in the art to provide, at a low cost, resonators of the BAW type capable of being adapted, without modifications, to specifications of various standards of equipment in which they are to be installed.

SUMMARY OF THE INVENTION

An embodiment comprises an acoustic wave resonator with adjustable resonance frequency comprising a piezoelectric element having two electrodes. According to a general feature of this resonator, a switching element forms an additional electrode being selectively disposed on top of one of the other two electrodes in order to make the total thickness of the electrode vary and to consequently modify the resonance frequency of the resonator.

Thus, the switching element has the choice of adopting a first inactive position in which it is separated from the electrode and from the piezoelectric element so as to make the resonator operate at a first characteristic frequency, or a second active position in which the switching element is applied against the piezoelectric element so as to make the resonator operate at a second characteristic frequency.

According to another feature, the switching element comprises a contact bar deformable between the first inactive position in which it is separated from the electrode and the second active position in which it is applied against the electrode, the contact bar comprising resistive heating elements designed to cause a deformation of the bar.

A simple heating of the contact bar thus allows the configuration of the switching element to be varied so that it adopts either the first inactive position or the second active position.

According to yet another feature, the first and second positions are stable positions. For example, the contact bar comprises bistable internal electrodes capable of maintaining the contact bar in the deformed state pushing against the electrode in one or other of the active positions.

Advantageously, the resonator forms part of an integrated circuit, the resonator being disposed on an oxide layer with interposition of an acoustic reflector, for example a Bragg mirror, the contact bar forming a bridge extending over the piezoelectric element.

For example, the contact bar has a length of around 400 microns and a width of around 50 microns.

According to a second aspect, a resonator such as is defined hereinabove is used for the fabrication of a high-frequency circuit, with variable resonance frequency, in the field of telephony.

In an embodiment, a bulk acoustic wave resonator comprises: a resonator structure including first and second electrodes; and a bistable MEMS structure which moves between a first position not in contact with one of the first and second electrodes and associated with a first resonant frequency of the resonator structure and a second position which is in contact with one of the first and second electrodes and associated with a second, different resonant frequency of the resonator structure.

In another embodiment, a bulk acoustic wave resonator comprises: a resonator structure including first and second electrodes, the resonator selectively operating at a first resonant frequency and a second resonant frequency; and a MEMS structure over the resonator structure which moves between a first position not in contact with one of the first and second electrodes to select the first resonant frequency and a second position which is in contact with one of the first and second electrodes to select the second, different, resonant frequency.

BRIEF DESCRIPTION OF THE DRAWINGS

Other advantages and features of the invention will become apparent on examining the detailed description of entirely non-limiting modes of implementation and embodiments, and from examining the appended drawings in which.

DETAILED DESCRIPTION OF THE DRAWINGS

Figure 1:
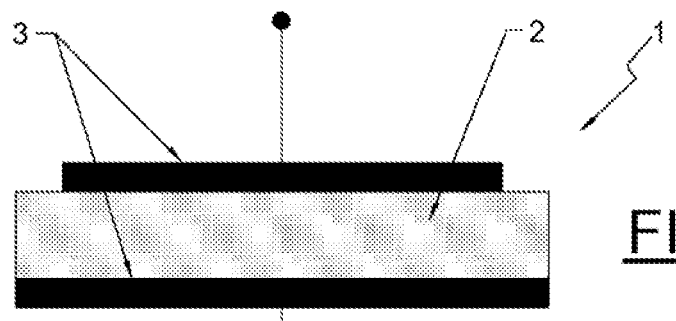
FIG. 1 shows the basic structure of a conventional bulk acoustic wave (BAW) resonator.

In FIG. 1 is shown the general architecture of a conventional bulk acoustic wave resonator and, in particular, a resonator known by the name of FBAR (Film Bulk Acoustic Resonator).

As can be seen in this figure, the FBAR resonator, denoted by the general numerical reference 1, is based on the use of a piezoelectric thin film 2 and two layers 3 of metal forming electrodes. As previously indicated, the fundamental resonance frequency of the resonator 1 is directly linked to the overall thickness of the piezoelectric element, including the electrodes 3.

In particular, when the thickness of the piezoelectric element increases, the fundamental frequency of the resonator is shifted towards lower frequencies.

However, as previously indicated, the fundamental frequency of the resonator is fixed by design so that the resonator has a fixed fundamental frequency.

Figure 2:
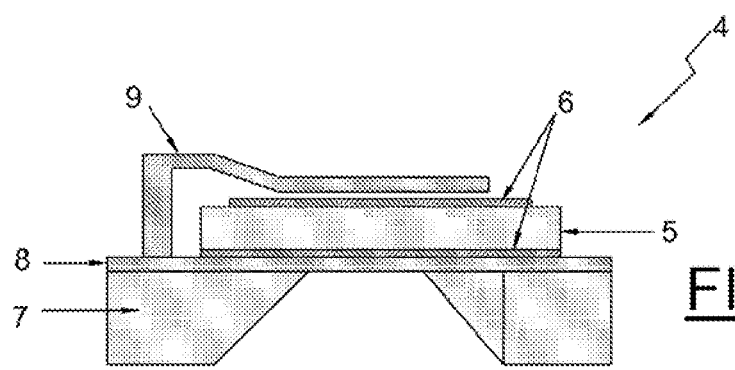
FIG. 2 illustrates the general principle of a BAW resonator.

In FIG. 2, a BAW resonator 4, according to the invention, is shown whose fundamental frequency is variable. This resonator is based on the use of a switching element capable of making the overall thickness of the resonator vary in order that it can selectively adopt any one of (or switch between) two characteristic resonance frequencies.

The switching element is preferably fabricated using a micro-electromechanical, or MEMS, technology so that the whole of the resonator may be disposed within a fully integrated circuit.

The resonator thus finds a particularly advantageous application in the field of telecommunications and, in particular, of mobile telephony, with the objective of producing high-frequency front-end circuits capable of operating according to the specifications of various standards. Thus, such a resonator with multiple characteristic resonance frequencies may be used for front-end circuits of cellular mobile telephones capable of operating, for example, either according to the 802.11 standard, in other words within the range of frequencies going from 2.4 to 2.48 GHz, or according to the WCDMA standard, in other words at frequencies going from 2.11 to 2.17 GHz.

In such an application, this resonator can, for example, be used in the fabrication of passive band filters for such front-end circuits.

The resonator may be associated, in this application, with a detection circuit which detects the standard being used, for example based on the level of input power, and which switches the switching element according to the standard detected from the input power level, for example by comparison with a threshold value.

As is shown in FIG. 2, the resonator 4 is also based on the use of a piezoelectric element 5 with two metal electrodes 6. The assembly is for example placed on a substrate 7, for example made of silicon or silicon-germanium with interposition of an underlayer 8, for example, of silicon nitride.

With regard to the switching element, in principle this is fabricated in the form of a metal beam or contact bar 9, for example made of aluminum, fabricated, as previously indicated, using a MEMS technology. This contact bar 9 is supported by the underlayer 8 and extends over the upper electrode 6. In the exemplary embodiment shown, the end of the contact bar is free to oscillate. The contact bar 9 can thus be activated in such a manner as to come into contact against the electrode 6 in order to increase the overall thickness of the piezoelectric resonator and, consequently, to modify the characteristic resonance frequency of the resonator.

For example, the piezoelectric layer 5 is formed from aluminum nitride, whereas the electrodes are formed from aluminum.

With the aim of avoiding acoustic losses in the substrate and of maintaining a high quality factor for the resonator, an acoustic reflector, for example a Bragg mirror (not shown), implanted into the substrate under the resonator, is interposed between the substrate and the resonator.

In FIGS. 3 to 6, one particular embodiment of a BAW resonator according to the invention is shown that is fabricated in a fully integrated form.

The resonator illustrated, denoted by the general reference 10, is for example formed over a metallization level of an integrated circuit, on an oxide layer 11, with interposition of a Bragg mirror.

In the exemplary embodiment shown, the switching element 12 rests, by its two mutually opposing ends 13 and 14, on an underlayer 15. It also forms a MEMS system.

The fabrication of such a bridge in the form of a micro-electromechanical system is within the capabilities of those skilled in the art. It will not therefore be described in detail in the following part of the description. It will however be noted that the contact bar 12 has internally resistive heating elements, such as 16, each being associated with a metal block 17 jointly providing heating of the bar. It also has a contact pad 18 designed to cooperate with, and come into contact with, an electrode 19 associated with the piezoelectric element of the resonator.

Figure 3:
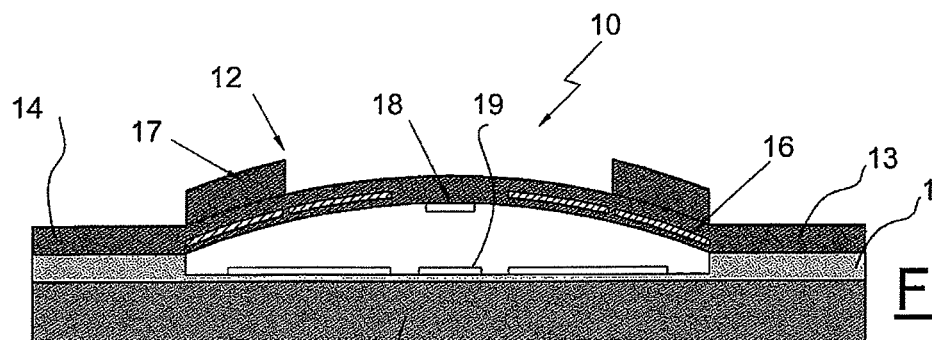
FIG. 3 is an exemplary embodiment of a BAW resonator.
Figure 4:
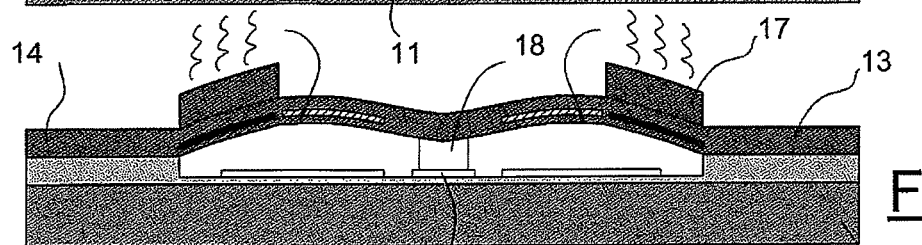
FIGS. 4 and 5 illustrate the operation of the BAW resonator in FIGS. 3.
Figure 5:
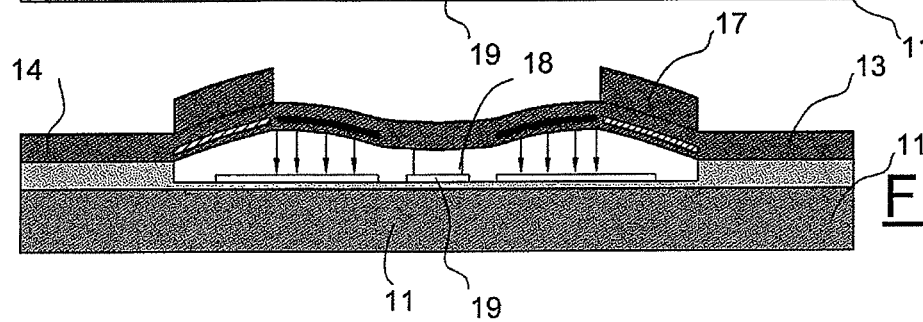

By heating, the contact bar 12 is able to adopt two configurations, namely a first inactive configuration, seen in FIG. 3, in which the contact element 18 is separated from the electrode 19 of the piezoelectric element 10, and a second position, seen in FIGS. 4 and 5, in which the contact element 18 is pushing against the upper electrode 19 (also reference 6) of the resonator, in order to make its fundamental resonance frequency vary.

It will be noted that the resistive elements 16 are bistable elements, in other words they are capable of being deformed, by heating, so as to adopt two respective stable forms corresponding to one or the other of the configurations of the contact bar 12 (FIG. 3 or FIGS. 4/5).

Figure 6:
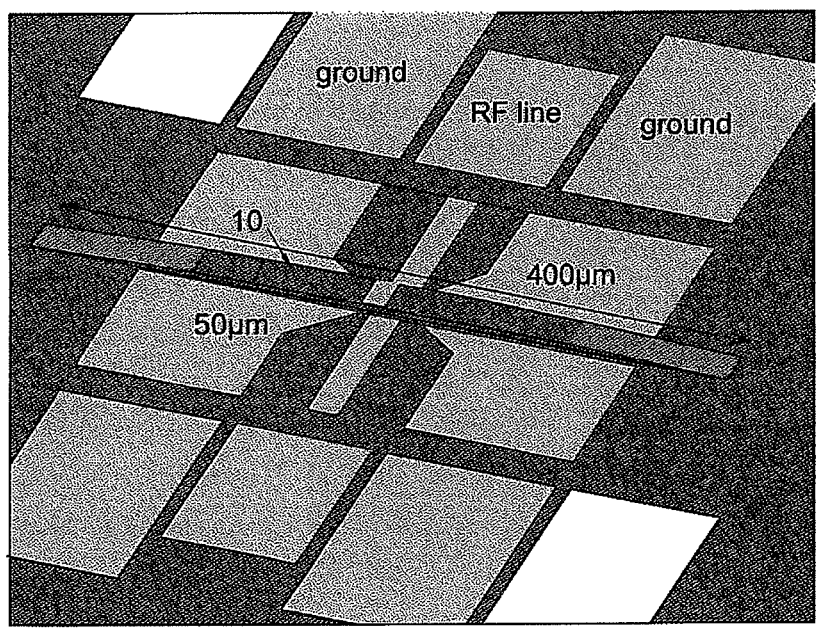
FIG. 6 is a perspective view of an integrated circuit board comprising a BAW resonator.

As can be seen, a BAW resonator with two resonance frequencies, as seen in the view of FIG. 6, can be produced that is capable of being fabricated in a fully integrated form.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

The invention claimed is:

1. Bulk acoustic wave resonator with adjustable resonance frequency, comprising:
    a piezoelectric element having first and second electrodes; and
    a switching element forming an additional electrode having a first position and further having a second position wherein the additional electrode is selectively disposed on top of one of the first and second electrodes in order to increase a total thickness of the electrode resulting in a modification of the resonance frequency of the resonator between a first non-zero resonance frequency and a second, different, non-zero resonance frequency;

wherein the switching element comprises at least one contact bar deformable between the first position in which the additional electrode is separated from said one of the first and second electrodes and the second position in which the additional electrode is applied against said one of the first and second electrodes;

wherein the first and second positions are stable positions; and wherein the contact bar comprises bistable internal electrodes which maintain the contact bar in the second position in response to heat.

2. Resonator according to claim 1, wherein the resonator forms part of an integrated circuit, the resonator being disposed on an oxide layer with interposition of an acoustic reflector, and wherein the contact bar forms a bridge extending over the upper one of the first or second electrodes of the piezoelectric resonator.

3. Resonator according to claim 2, wherein the acoustic reflector is a Bragg mirror.

4. Resonator according to claim 2, wherein the length of the contact bar is around 400 microns and its width is around 50 microns.

5. Resonator according to claim 2 wherein the bridge is deformed in a center section thereof so as to move the additional electrode into contact with one of the first and second electrodes.

6. Resonator according to claim 2 wherein the bridge comprises a MEMS structure.

7. Resonator according to claim 1, wherein the bistable internal electrodes comprise resistive heating elements which, when activated, cause a deformation in position of the bar away from the first position and towards the second position.

8. Resonator according to claim 1 wherein the switching element comprises a MEMS structure.

9. The resonator according to claim 1 wherein the contact bar comprises a MEMS structure.

10. Resonator according to claim 1 wherein the switching element comprises a bistable MEMS structure which moves between the first and second positions in response to heat.

11. The resonator of claim 1 formed as an integrated circuit.

12. The resonator of claim 11 wherein the integrated circuit is a mobile telephony integrated circuit, and wherein the first resonant frequency is associated with a first communications frequency of the mobile telephony integrated circuit and the second resonant frequency is associated with a second communications frequency of the mobile telephony integrated circuit.

* * * * *